United States Patent
Yang et al.

(10) Patent No.: US 11,563,063 B2
(45) Date of Patent: Jan. 24, 2023

(54) OLED DISPLAY SUBSTRATE COMPRISING CAMERA AND PROTECTIVE LAYER, FABRICATING METHOD THEREOF, AND DISPLAY DEVICE

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Lu Yang, Beijing (CN); Dawei Shi, Beijing (CN); Wentao Wang, Beijing (CN); Cenhong Duan, Beijing (CN); Pei Wang, Beijing (CN); Xu Li, Beijing (CN); Can Huang, Beijing (CN); Bangwei Wu, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 276 days.

(21) Appl. No.: 16/848,151

(22) Filed: Apr. 14, 2020

(65) Prior Publication Data
US 2021/0028251 A1      Jan. 28, 2021

(30) Foreign Application Priority Data

Jul. 22, 2019   (CN) .......................... 201910661688.0

(51) Int. Cl.
*H01L 27/32*     (2006.01)
*H01L 51/00*     (2006.01)
(Continued)

(52) U.S. Cl.
CPC ...... *H01L 27/3234* (2013.01); *H01L 27/3246* (2013.01); *H01L 51/0097* (2013.01);
(Continued)

(58) Field of Classification Search
CPC ............. H01L 27/3234; H01L 27/3246; H01L 27/3258; H01L 27/3241; H01L 51/0097;
(Continued)

(56) References Cited

U.S. PATENT DOCUMENTS 10,347,866 B1   7/2019  Kim
2017/0346027 A1* 11/2017 Ishiyama ............ H01L 51/5253
(Continued)

FOREIGN PATENT DOCUMENTS

CN          1353411 A       6/2002
CN        107919364 A       4/2018
(Continued)

OTHER PUBLICATIONS

First Office Action with Search Report dated Feb. 22, 2021 corresponding to Chinese application No. 201910661688.0.

*Primary Examiner* — Hoai V Pham
(74) *Attorney, Agent, or Firm* — Nath, Goldberg & Meyer; Joshua B. Goldberg

(57) ABSTRACT

The present disclosure provides an OLED display substrate, a fabricating method thereof and a display device. The OLED display substrate includes a substrate; an inorganic layer and a light-emitting unit on substrate, light-emitting unit being on a side of inorganic layer away from substrate and including a light-emitting structure; a camera on a side of substrate away from inorganic layer, and light-emitting unit being not in orthographic projection region; a protective layer in orthographic projection region and on side of inorganic layer away from substrate, wherein protective layer is configured to protect inorganic layer in orthographic
(Continued)

projection region from warping or cracking in a process of removing part of light-emitting structure in orthographic projection region by laser cutting.

19 Claims, 2 Drawing Sheets

(51) Int. Cl.
  *H01L 51/52* (2006.01)
  *H01L 51/56* (2006.01)
(52) U.S. Cl.
  CPC .......... *H01L 51/5253* (2013.01); *H01L 51/56* (2013.01); *H01L 2251/303* (2013.01); *H01L 2251/5338* (2013.01); *H01L 2251/558* (2013.01)
(58) Field of Classification Search
  CPC . H01L 51/5253; H01L 51/56; H01L 51/5012; H01L 51/52; H01L 51/5203; H01L 51/5237; H01L 2251/5538; H01L 2251/558; H01L 2251/301; H01L 2251/53; Y02E 10/549
  USPC .......................................................... 257/40
  See application file for complete search history.

(56) References Cited

U.S. PATENT DOCUMENTS

2020/0203445 A1* 6/2020 Ou ...................... H01L 27/3218
2021/0098556 A1* 4/2021 Jang ................... H01L 27/3258

FOREIGN PATENT DOCUMENTS

| CN | 108364987 A | 8/2018 |
| CN | 108666352 A | 10/2018 |
| CN | 109616506 A | 4/2019 |

* cited by examiner

OLED DISPLAY SUBSTRATE COMPRISING CAMERA AND PROTECTIVE LAYER, FABRICATING METHOD THEREOF, AND DISPLAY DEVICE

CROSS REFERENCE TO RELATED APPLICATION

This application claims priority to Chinese patent application No. 201910661688.0, filed on Jul. 22, 2019, the entire contents of which are incorporated herein by reference.

TECHNICAL FIELD

The present disclosure belongs to the field of display technology, and particularly relates to an OLED display substrate, a fabricating method thereof and a display device.

BACKGROUND

An Organic Light-Emitting Diode (OLED) display panel has the advantages of self-luminescence, wide viewing angle, vivid color, ultra-thin thickness, flexibility, and the like, and is widely applied in the display field. With the development of technologies such as narrow bezel and the like, the screen-to-body ratio of the OLED display panel is higher and higher at present, and the real full-screen technology is expected to be realized.

SUMMARY

In one aspect, the present disclosure provides an OLED display substrate, including:
a substrate;
an inorganic layer and a light-emitting unit on the substrate, the light-emitting unit being on a side of the inorganic layer away from the substrate and including a light-emitting structure;
a camera on a side of the substrate away from the inorganic layer, an orthographic projection region, and the light-emitting unit being not present in an orthographic projection region of the camera on the substrate;
a protective layer in the orthographic projection region and on the side of the inorganic layer away from the substrate,
wherein the protective layer is configured to protect the inorganic layer in the orthographic projection region from warping or cracking in a process of removing a part of the light-emitting structure in the orthographic projection region by laser cutting.

In an embodiment, the protective layer is made of an amorphous indium zinc oxide material.

In an embodiment, the protective layer has a thickness in a range of 30 nm-100 nm.

In an embodiment, the light-emitting unit further includes an anode, the light-emitting structure includes a light-emitting functional layer and a cathode, and the anode, the light-emitting functional layer and the cathode are sequentially arranged in a direction away from the inorganic layer.

In an embodiment, the substrate is made of polyimide material.

In an embodiment, the OLED display substrate further includes isolation pillars at sides of the orthographic projection region, In an embodiment, the OLED display substrate further includes pixel definition layers at sides of the orthographic projection region.

In an embodiment, the OLED display substrate further includes an organic encapsulation layer and an inorganic encapsulation layer, the organic encapsulation layer being between the isolation pillars and the pixel definition layers, and the inorganic encapsulation layer covering a light-emitting surface of the OLED display substrate.

In another aspect, a display device is also provided, which includes the OLED display substrate according to the embodiment of the present disclosure.

In another aspect, a method for fabricating an OLED display substrate is also provided, the OLED display substrate being the OLED display substrate according to the embodiments of the present disclosure, and the method includes:
forming the inorganic layer, the protective layer, and the light-emitting unit on the substrate;
forming the camera on the side of the substrate away from the inorganic layer; and
removing the part of the light-emitting structure of the light-emitting unit in the orthographic projection region of the camera on the substrate, by laser cutting.

In an embodiment, the forming the protective layer includes:
forming an indium zinc oxide film having an amorphous structure at room temperature by direct current magnetron sputtering;
exposing the indium zinc oxide film having the amorphous structure by using a mask plate containing a pattern of the protective layer; and
carrying out wet etching on the exposed indium zinc oxide film having the amorphous structure by using oxalic acid, to remove the indium zinc oxide film having the amorphous structure in an region outside the orthographic projection region, and remain the indium zinc oxide film having the amorphous structure in the orthographic projection region.

In an embodiment, the forming the protective layer includes:
forming an indium zinc oxide film by spin coating through sol-gel method, and then annealing at 300° C. to form the indium zinc oxide film having an amorphous structure;
exposing the indium zinc oxide film having the amorphous structure by using a mask plate containing a pattern of the protective layer; and
carrying out wet etching on the exposed indium zinc oxide film having the amorphous structure by using oxalic acid, to remove the indium zinc oxide film having the amorphous structure in an region outside the orthographic projection region, and remain the indium zinc oxide film having the amorphous structure in the orthographic projection region.

In an embodiment, the forming the light-emitting unit includes forming an anode and the light-emitting structure, the light-emitting structure including a light-emitting functional layer and a cathode, and the forming the protective layer and the light-emitting unit includes:
forming the anode;
etching and removing a part of the anode in the orthographic projection region by using strong acid liquid;
subsequently forming the protective layer; and
subsequently forming the light-emitting structure.

In an embodiment, the forming the light-emitting unit includes forming an anode and the light-emitting structure, the light-emitting structure including a light-emitting functional layer and a cathode, and the forming the protective layer and the light-emitting unit includes:

forming the protective layer;

subsequently forming the anode;

etching and removing a part of the anode in the orthographic projection region by using strong acid liquid; and subsequently forming the light-emitting structure.

In an embodiment, the anode is formed by processes of sputtering, exposure, development and etching; and the light-emitting functional layer and the cathode are formed by an evaporation process.

In an embodiment, the forming the inorganic layer includes forming the inorganic layer by a physical vapor deposition process.

In an embodiment, the forming the inorganic layer includes:

forming an inorganic layer film by a physical vapor deposition process; and etching and thinning the inorganic layer film in the orthographic projection region to form the inorganic layer.

In an embodiment, the method further includes:

prior to formation of the protective layer, forming isolation pillars and pixel definition layers at sides of the orthographic projection region.

In an embodiment, the method further includes:

forming an organic encapsulation layer between the isolation pillars and the pixel definition layers; and forming an inorganic encapsulation layer for covering a light-emitting surface of the OLED display substrate,

DETAILED DESCRIPTION

In order to make those skilled in the art better understand the technical solutions of the present disclosure, an OLED display substrate, a fabricating method thereof, and a display device of the present disclosure are described in detail below with reference to the accompanying drawings and the specific embodiments.

In order to realize the real full screen technology, the under-screen camera technology emerges. The display screen is required to have a high transmittance at the position of the camera under the display screen, otherwise, the definition of the captured picture is not high. The organic light-emitting functional layer and other organic layers with larger thicknesses (such as a pixel definition layer, a spacer and an organic layer for encapsulating the light-emitting functional layer) have larger influence on the transmittance in the screen. It is therefore necessary to remove these film layers. In the backboard process of the display screen, the pixel definition layer and the spacer can be removed by using a mask plate through exposure and development. The organic layer is usually formed by ink jet printing, and thus the organic layer can be blocked from flowing into the camera hole by designing a ring of dam around the region corresponding to the camera. In the vaporization of the organic light-emitting functional layer, the metal mask plate is used. However, the metal mask plate is very thin, and the vaporization pattern is generally uniform. At present, it is not possible to add a shelter for a large circular hole area corresponding to the camera into the metal mask, since this will affect the uniformity of the tension of the metal mask plate, which will cause the normal evaporation pattern to deform, and further cause undesirable phenomenon such as color mixture of the display screen. Therefore, in the current technology, the light-emitting functional layer in the region corresponding to the camera is removed by laser cutting after the light-emitting functional layer is evaporated.

In the solution of removing the light-emitting functional layer in the region corresponding to the camera by laser cutting, when the light-emitting functional layer is removed by laser cutting, warps or cracks would occur to an inorganic layer below the light-emitting functional layer, and then particles are generated, thereby affecting the packaging reliability of OLED display screen in the following process.

Figure 1:
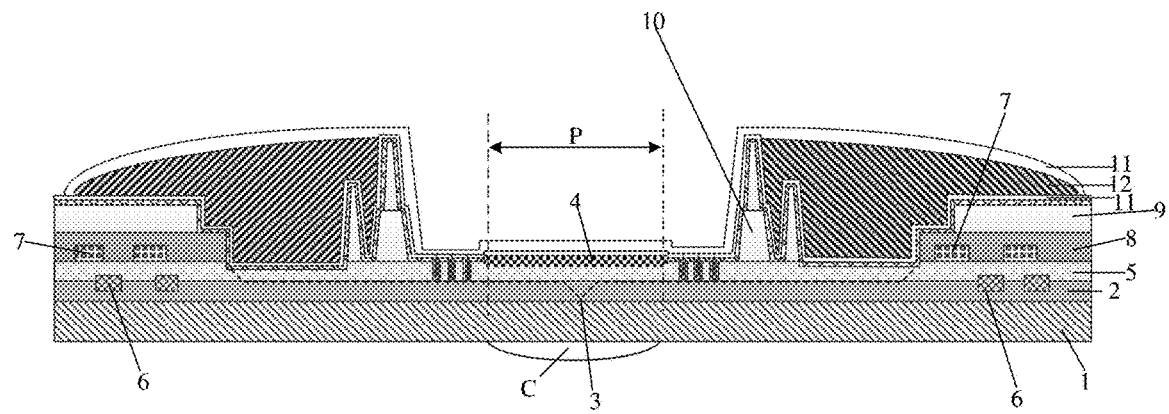
FIG. 1 is a cross-sectional view of an OLED display substrate in an embodiment of the present disclosure.

The embodiment provides an OLED display substrate, as shown in FIG. 1, including a substrate 1, and an inorganic layer 2 and a light-emitting unit 3 on the substrate 1. The light-emitting unit 3 is on a side of the inorganic layer 2 away from the substrate 1. A side of the substrate 1 away from the inorganic layer 2 is provided. with a camera C, and the light-emitting unit 3 is not present in the orthographic projection region P of the camera C on the substrate 1. The light-emitting unit 3 includes a light-emitting structure. A protective layer 4 is in the orthographic projection region P and on a side of the inorganic layer 2 away from the substrate 1, and the protective layer 4 can protect the inorganic layer 2 in the orthographic projection region P from warping or cracking when a part of the light-emitting structure in the orthographic projection region P is removed by laser cutting.

In an embodiment, the light-emitting unit 3 includes a plurality of light-emitting units defined by pixel definition layers 9, and the pixel definition layers and the light-emitting units in the orthographic projection region P are removed.

In an embodiment, the light-emitting unit 3 includes an anode, a light-emitting functional layer and a cathode, which are sequentially arranged in a direction away from the inorganic layer 2. The light-emitting structure includes a light-emitting functional layer and a cathode. That is, the light-emitting unit 3 includes an anode and a light-emitting structure. The OLED display substrate includes a thin film transistor, and the inorganic layer 2 includes a first sub-layer, a buffer layer, a gate insulating layer, and an interlayer insulating layer 5. In an embodiment, the interlayer insulating layer 5 is made of an inorganic material. The first sub-layer, the buffer layer, the gate insulating layer, and the interlayer insulating layer 5 are sequentially stacked and arranged in a direction away from the substrate 1. The thin film transistor includes a P-Si active layer (not shown in the figure), a gate electrode 6 and source and drain electrodes 7. The P-Si active layer is on a side of the buffer layer away from the substrate 1. The gate electrode 6 is on a side of the gate insulating layer away from the substrate 1. The interlayer insulating layer 5 is on a side of the gate electrode 6 away from the substrate 1. The source and drain electrodes are on a side of the interlayer insulating layer 5 away from the substrate 1. The inorganic layer 2 is remained in the orthographic projection region P of the camera on the substrate 1, and the P-Si active layer, the gate electrode 6 and the source and drain electrodes 7 are not remained in the orthographic projection region R By providing the protective layer 4, when the light-emitting structure in the orthographic projection region P is removed by laser cutting, on one hand, the protective layer 4 can prevent laser cutting energy (including laser energy and laser heat) from causing damage to the inorganic layer 2, on the other hand, the protective layer 4 can have the suppression effect on the inorganic layer 2 in the laser cutting process, to prevent the inorganic layer 2 in the orthographic projection region P from warping or breaking, thereby avoiding the generation of the particles when the light-emitting structure is subjected to laser cutting, and then ensuring the packaging reliability of the OLED display screen in the following process.

In the embodiment, the protective layer 4 is made of an amorphous indium zinc oxide material. The protective layer 4 made of the material has a smooth and compact surface, a light transmittance higher than 90%, and stable optical performance, so that the protective layer can not only protect the inorganic layer 2 during laser cutting, but also basically has no influence on the light transmittance, and thus, the camera can further capture pictures normally through the protective layer. The thickness of the protective layer 4 is in the range of 30 nm-100 nm.

In addition, in the embodiment, the substrate 1 is made of a polyimide material. The substrate 1 is composed of two polyimide film layers. The substrate 1 made of the material can not only normally transmit light, but also realize flexible deformation of the OLED display substrate. The substrate 1 made of the material may release gas in the laser cutting process, and if the released gas enters the inside of the light-emitting unit 3 of the OLED display substrate, the OLED display substrate may have the defect such as growing dark spot (GDS). The inorganic layer 2 can prevent the gas released by the substrate 1 during the laser cutting process from entering into the inside of the light-emitting unit 3, and ensure the normal display of the OLED display substrate.

In addition, in the embodiment, the OLED display substrate further includes a planarization layer 8 and pixel definition layers 9 on a side of the source and drain electrodes 7 away from the substrate 1, and the planarization layer 8 and the pixel definition layers 9 are not present in the orthographic projection region P. The OLED display substrate further includes isolation pillars 10, and the isolation pillars 10 are on sides of the orthographic projection region P of the camera on the substrate 1. The region of the OLED display substrate outside the orthographic projection region P is encapsulated through a stack of an inorganic encapsulation layer 11 and an organic encapsulation layer 12, and the orthographic projection region P is encapsulated only through the inorganic encapsulation layer 11. The isolation pillars 10 are used for supporting a subsequent packaging film layer of a region outside the orthographic projection region P of the OLED display substrate, and forming a cavity above the light-emitting side of the orthographic projection region P, so that the camera can normally capture pictures through the cavity. In addition, the isolation pillars 10 can prevent cracks due to cutting from extending to a display region during laser cutting, so that the defect such as the GDS of the OLED display substrate is avoided.

Based on the above structure of the OLED display substrate, the embodiment further provides a method for fabricating the OLED display substrate, including forming an inorganic layer, a protective layer, and a light-emitting unit on a substrate, and removing a part of the light-emitting structure of the light-emitting unit in the orthographic projection region of the camera on the substrate by laser cutting.

Figure 2:
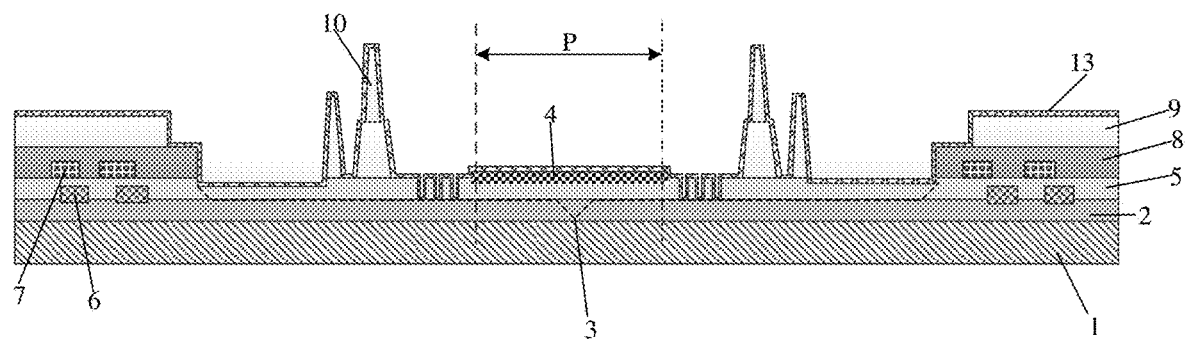
FIG. 2 is a cross-sectional view of an OLED display substrate of the present disclosure prior to laser cutting.
Figure 3:
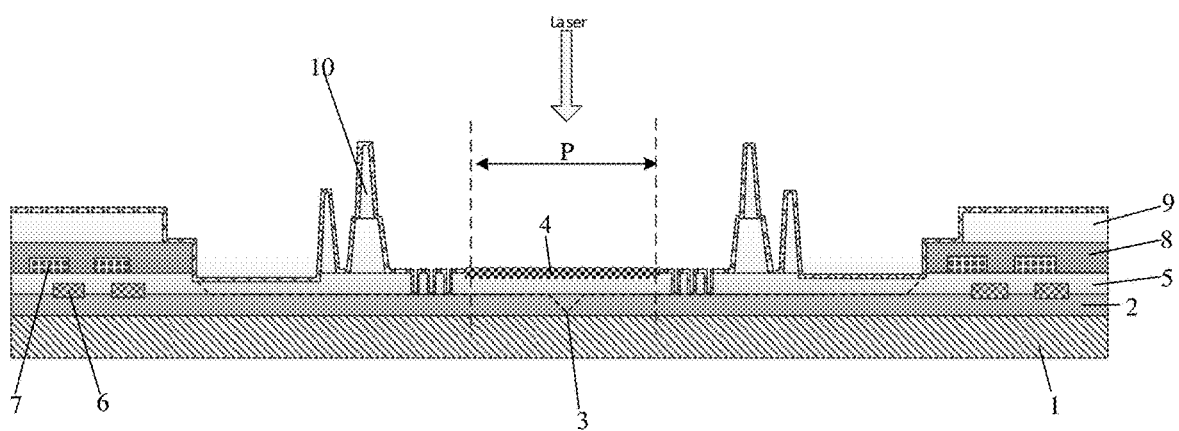
FIG. 3 is a cross-sectional view of an OLED display substrate of the present disclosure after laser cutting is completed.
Figure 4:
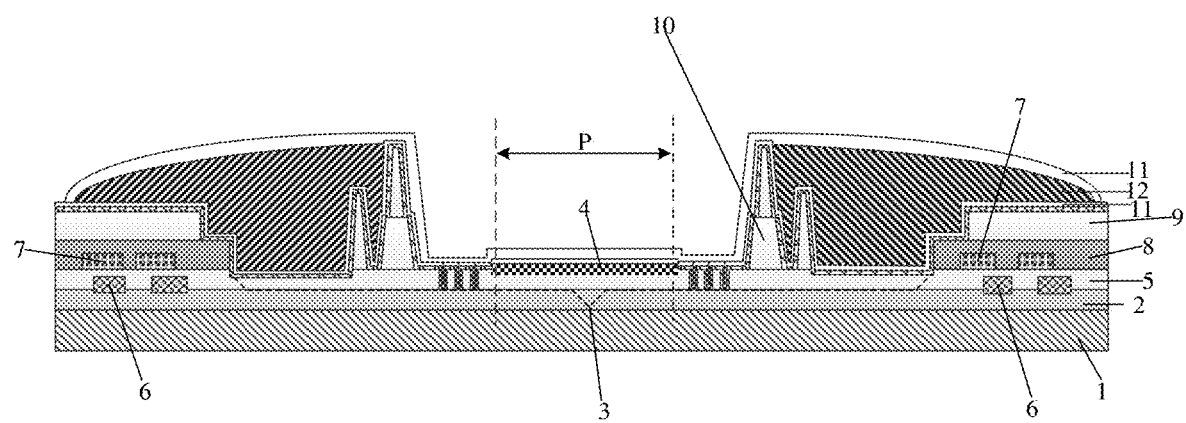
FIG. 4 is a cross-sectional view of an OLED display substrate of the present disclosure after encapsulation is completed.

The method for fabricating the OLED display substrate includes the following steps S1 to S11, as shown in FIGS. 2-4.

Step S1 includes forming a substrate 1 including two flexible polyimide film layers, on a glass substrate by coating and heating curing processes.

Step S2 includes forming an inorganic layer 2 by physical vapor deposition (PVD) process, forming the inorganic layer including sequentially forming a first sub-layer, a buffer layer and a gate insulating layer. In an embodiment, a P-Si active layer is formed using a conventional patterning process after forming the buffer layer, and then the gate insulating layer is formed.

Step S3 includes forming a gate electrode 6 by sputtering, exposure, etching and photoresist stripping processes.

Step S4 includes forming an interlayer insulating layer 5 by plasma vapor deposition, exposure, etching and photoresist stripping processes.

Step S5 includes forming source and drain electrodes 7 by sputtering, exposure, etching and photoresist stripping processes.

Step S6 includes forming a planarization layer 5 by masking, exposure and development processes, and removing materials of the planarization layer in the orthographic projection region P of the camera so as to avoid influencing the transmittance.

Step S7 includes forming an anode (not shown in the figure) of the light-emitting unit by sputtering, exposure, etching and photoresist stripping processes. The anode is made of ITO material or a stack of ITO, Ag and ITO materials. The anode made of single ITO material is formed by etching with strong acid liquid such as $HNO_3$ or $H_2SO_4$, and the anode made of the stack of ITO, Ag and ITO materials is formed by etching with $HNO_3$ or $H_3PO_4$ to form a pattern. Anode material in the orthographic projection region P of the camera on the substrate 1 is removed.

Step S8 includes forming the pixel definition layers 9 and the isolation pillars 10 by masking, exposure and development. In an embodiment, the pixel definition layers 9 and the isolation pillars 10 are made of an organic material. The materials of the pixel definition layers 9 and the isolation pillars 10 in the orthographic projection region P of the camera on the substrate 1 are removed, thereby avoiding the influence of the two thick layers of organic materials on the light transmittance.

Step S9 includes forming a protective layer 4 on the substrate subjected to the above steps at room temperature by direct current magnetron sputtering.

In this step, forming the protective layer 4 includes:

forming an indium zinc oxide film having an amorphous structure at room temperature by direct current magnetron sputtering;

exposing the indium zinc oxide film having the amorphous structure by using a mask plate containing a pattern of the protective layer, and carrying out wet etching on the exposed indium zinc oxide film having the amorphous structure by using oxalic acid, to remove the indium zinc oxide film having the amorphous structure in an region outside the orthographic projection region P, and to remain the indium zinc oxide film having the amorphous structure in the orthographic projection region P.

For this material having this structure, a wet etch is performed using oxalic acid, which can form water-soluble complexes after reacting with many kinds of metals. For example, the chemical equation for the reaction of oxalic acid with zinc is $H_2C_2O_4+Zn=ZnC_2O_4+H_2\uparrow$. Oxalic acid has general acidity. In addition, etching the indium zinc oxide film with oxalic acid (HOOC-COOH) does not damage the anode material.

It should be noted that the protective layer 4 may also be fabricated by another method, that is, by forming an indium zinc oxide film by spin coating through sol-gel method, and then performing an annealing process at 300° C. to form the indium zinc oxide film having an amorphous structure; exposing the indium zinc oxide film having the amorphous structure by using a mask plate containing a pattern of the protective layer; and carrying out wet etching on the exposed indium zinc oxide film having the amorphous structure by using oxalic acid, to remove the indium zinc oxide film having the amorphous structure in an region outside the orthographic projection region P, and to remain the indium zinc oxide film having the amorphous structure in the orthographic projection region P.

Step S10 includes carrying out evaporation of a light-emitting structure material 13 (referring to FIG. 2); and then, cutting a part of the light-emitting structure material 13 in the orthographic projection region P of the camera on the substrate 1 by using vacuum laser to remove the part of the light-emitting structure material 13 in the orthographic projection region P of the camera. The protective layer 4 can protect the underlying inorganic layer 2, and prevent the inorganic layer 2 from warping or cracking during laser cutting, so as to avoid generating particles and affecting the subsequent packaging reliability.

In an embodiment, the light-emitting structure material 13 includes a light-emitting material (i.e., a material forming a light-emitting functional layer) and a cathode material. In an embodiment, the light-emitting material is evaporated only in the region between the pixel definition layers 9.

It should be noted that, forming the light-emitting unit 3 includes sequentially forming an anode, a light-emitting functional layer, and a cathode, and the light-emitting functional layer and the cathode are both formed by an evaporation process.

Step S11 includes carrying out an encapsulating process to complete the fabrication of the whole OLED display substrate.

The step includes encapsulating the substrate subjected to the above steps by using an inorganic encapsulation layer 11 and an organic encapsulation layer 12.

In an embodiment (referring to FIG. 4), the organic encapsulation layer 12 serves to encapsulate the region between the isolation pillars and the pixel definition layers, and the inorganic encapsulation layer 11 serves to cover the entire light-emitting surface of the OLED display substrate.

In the embodiment, the protective layer 4 is formed after the anode is formed and before the light-emitting functional layer is formed. It should be noted that the protective layer 4 may be formed after the inorganic layer 2 is formed and before the anode is formed.

In addition, it should be noted that when the technique of bending the bezel region to the back side to realize a full screen is adopted in the OLED display substrate, the bezel region may be thinned by thinning the inorganic layer, so that the bezel region may be bent to the back side. In this case, the inorganic layer in the orthographic projection region of the camera on the substrate may also be thinned at the same time to realize a higher light transmittance when the camera takes a picture. At this time, forming the inorganic layer may also include forming the inorganic layer film by using a physical vapor deposition method; and etching and thinning the inorganic layer film in the orthographic projection region to form the inorganic layer.

However, it should be noted that the inorganic layer in the orthographic projection region of the camera on the substrate cannot be completely removed, because the substrate made of polyimide material releases gas during laser cutting, and the released gas enters into the light-emitting unit to damage the substrate and cause defect such as GDS. Therefore, the inorganic layer having the thickness of at least about 2000 Å needs to remain in the orthographic projection region of the camera to prevent the released gas from entering into the light-emitting unit.

The beneficial effects of the above embodiments are as follows: in the MED display substrate having the protective layer, when the light-emitting structure in the orthographic projection region P is removed by laser cutting, on one hand, the protective layer 4 can prevent laser cutting energy from causing damage to the inorganic layer 2, and on the other hand, the protective layer 4 can have the suppression effect on the inorganic layer 2 in the laser cutting process, to prevent the inorganic layer 2 in the orthographic projection region P from warping or breaking, thereby avoiding the generation of the particle when the light-emitting structure is subjected to laser cutting, and then ensuring the packaging reliability of the OLED display screen in the following process.

The embodiments further provide a display device including the OLED display substrate in the above embodiment.

By adopting the OLED display substrate in the embodiment, the packaging quality and the display quality of the display device can be improved.

It could be understood that the above embodiments are merely exemplary embodiments employed to illustrate the principle of the present disclosure, and the present disclosure is not limited thereto. It will be apparent to those skilled in the art that various changes and modifications can be made without departing from the spirit and scope of the present disclosure, and these changes and modifications are also considered to be within the protection scope of the present disclosure.

What is claimed is:

1. An OLED display substrate, comprising:
   a substrate;
   an inorganic layer and a light-emitting unit on the substrate, the light-emitting unit being on a side of the inorganic layer away from the substrate and comprising a light-emitting structure;
   a camera on a side of the substrate away from the inorganic layer, the light-emitting unit being not in an orthographic projection region of the camera on the substrate, wherein the orthographic projection region is a region where an orthographic projection of the camera on the substrate is located;
   a protective layer in the orthographic projection region and on the side of the inorganic layer away from the substrate,
   wherein the protective layer is configured to protect the inorganic layer in the orthographic projection region from warping or cracking in a process of removing a part of the light-emitting structure in the orthographic projection region by laser cutting.

2. The OLED display substrate of claim 1, wherein the protective layer is made of an amorphous indium zinc oxide material.

3. The OLED display substrate of claim 2, wherein the protective layer has a thickness in a range of 30 nm-100 nm.

4. The OLED display substrate of claim 1, wherein the light-emitting unit further comprises an anode, the light-emitting structure comprises a light-emitting functional layer and a cathode, and the anode, the light-emitting functional layer and the cathode are sequentially arranged in a direction away from the inorganic layer.

5. The OLED display substrate of claim 1, wherein the substrate is made of polyimide material.

6. The OLED display substrate of claim 1, further comprising isolation pillars at sides of the orthographic projection region.

7. The OLED display substrate of claim 6, further comprising pixel definition layers at sides of the orthographic projection region.

8. The OLED display substrate of claim 7, further comprising an organic encapsulation layer and an inorganic encapsulation layer, the organic encapsulation layer being between the isolation pillars and the pixel definition layers, and the inorganic encapsulation layer covering a light-emitting surface of the OLED display substrate.

9. A display device, comprising an OLED display substrate, wherein the OLED display substrate is the OLED display substrate of claim 1.

10. A method for fabricating an OLED display substrate, the OLED display substrate being the OLED display substrate of claim 1, the method comprising:
 forming the inorganic layer, the protective layer, and the light-emitting unit on the substrate;
 forming the camera on the side of the substrate away from the inorganic layer; and
 removing the part of the light-emitting structure of the light-emitting unit in the orthographic projection region of the camera on the substrate, by laser cutting.

11. The method of claim 10, wherein the forming the protective layer comprises:
 forming an indium zinc oxide film having an amorphous structure at room temperature by direct current magnetron sputtering;
 exposing the indium zinc oxide film having the amorphous structure by using a mask plate containing a pattern of the protective layer; and
 carrying out wet etching on the exposed indium zinc oxide film having the amorphous structure by using oxalic acid, to remove the indium zinc oxide film having the amorphous structure in a region outside the orthographic projection region, and remain the indium zinc oxide film having the amorphous structure in the orthographic projection region.

12. The method of claim 10, wherein the forming the protective layer comprises:
 forming an indium zinc oxide film by spin coating through sol-gel method, and then annealing at 300° C. to form the indium zinc oxide film having an amorphous structure;
 exposing the indium zinc oxide film having the amorphous structure by using a mask plate containing a pattern of the protective layer; and
 carrying out wet etching on the exposed indium zinc oxide film having the amorphous structure by using oxalic acid, to remove the indium zinc oxide film having the amorphous structure in a region outside the orthographic projection region, and remain the indium zinc oxide film having the amorphous structure in the orthographic projection region.

13. The method of claim 12, wherein the forming the light-emitting unit comprises forming an anode and the light-emitting structure, the light-emitting structure comprising a light-emitting functional layer and a cathode, and the forming the protective layer and the light-emitting unit comprises:
 forming the anode;
 etching and removing a part of the anode in the orthographic projection region by using strong acid liquid;
 subsequently forming the protective layer; and
 subsequently forming the light-emitting structure.

14. The method of claim 13, wherein the anode is formed by processes of sputtering, exposure, development and etching; and the light-emitting functional layer and the cathode are formed by an evaporation process.

15. The method of claim 12, wherein the forming the light-emitting unit comprises forming an anode and the light-emitting structure, the light-emitting structure comprising a light-emitting functional layer and a cathode, and the forming the protective layer and the light-emitting unit comprises:
 forming the protective layer;
 subsequently forming the anode;
 etching and removing a part of the anode in the orthographic projection region by using strong acid liquid; and
 subsequently forming the light-emitting structure.

16. The method of claim 10, wherein the forming the inorganic layer comprises forming the inorganic layer by a physical vapor deposition process.

17. The method of claim 10, wherein the forming the inorganic layer comprises:
 forming an inorganic layer film by a physical vapor deposition process; and
 etching and thinning the inorganic layer film in the orthographic projection region to form the inorganic layer.

18. The method of claim 10, further comprising:
 prior to forming the protective layer, forming isolation pillars and pixel definition layers at sides of the orthographic projection region.

19. The method of claim 18, further comprising:
 forming an organic encapsulation layer between the isolation pillars and the pixel definition layers; and
 forming an inorganic encapsulation layer for covering a light-emitting surface of the OLED display substrate.

* * * * *